US009565405B2

(12) United States Patent
Chen et al.

(10) Patent No.: US 9,565,405 B2
(45) Date of Patent: Feb. 7, 2017

(54) IMAGE SENSOR WITH ENHANCED QUANTUM EFFICIENCY

(71) Applicant: OMNIVISION TECHNOLOGIES, INC., Santa Clara, CA (US)

(72) Inventors: Gang Chen, San Jose, CA (US); Dominic Massetti, San Jose, CA (US); Chih-Wei Hsiung, San Jose, CA (US); Arvind Kumar, Fremont, CA (US); Yuanwei Zheng, San Jose, CA (US); Duli Mao, Sunnyvale, CA (US); Dyson H. Tai, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 145 days.

(21) Appl. No.: 14/612,961

(22) Filed: Feb. 3, 2015

(65) Prior Publication Data
US 2016/0227147 A1 Aug. 4, 2016

(51) Int. Cl.
H04N 9/04 (2006.01)
H01L 27/146 (2006.01)
H04N 5/3745 (2011.01)

(52) U.S. Cl.
CPC .......... *H04N 9/045* (2013.01); *H01L 27/1464* (2013.01); *H01L 27/14641* (2013.01);
(Continued)

(58) Field of Classification Search
CPC .......... H01L 27/14647; H01L 27/1463; H01L 27/1464; H04N 9/045
See application file for complete search history.

(56) References Cited

U.S. PATENT DOCUMENTS 4,011,016 A 3/1977 Layne et al.
4,238,760 A 12/1980 Carr
(Continued)

FOREIGN PATENT DOCUMENTS

WO WO 02/27804 A2 4/2002

OTHER PUBLICATIONS

Honda, H. et al., "A Color CMOS Imager With 4×4 White-RGB Color Filter Array for Increased Low-Illumination Signal-to-Noise Ratio," IEEE Transactions on Electron Devices, vol. 56, No. 11, Nov. 2009, IEEE, pp. 2398-2402.
(Continued)

*Primary Examiner* — Paul Berardesca
(74) *Attorney, Agent, or Firm* — Blakely Sokoloff Taylor & Zafman LLP

(57) ABSTRACT

A back side illuminated image sensor includes a pixel array including semiconductor material, and image sensor circuitry disposed on a front side of the semiconductor material to control operation of the pixel array. A first pixel includes a first doped region disposed proximate to a back side of the semiconductor material and extends into the semiconductor material a first depth to reach the image sensor circuitry. A second pixel with a second doped region is disposed proximate to the back side of the semiconductor material and extends into the semiconductor material a second depth which is less than the first depth. A third doped region is disposed between the second doped region and the image sensor circuitry on the front side of the semiconductor material. The third doped region is electrically isolated from the first doped region and the second doped region.

20 Claims, 4 Drawing Sheets

(52) U.S. Cl.
CPC ... *H01L 27/14647* (2013.01); *H04N 5/37457* (2013.01); *H01L 27/14627* (2013.01)

(56) References Cited

U.S. PATENT DOCUMENTS

| | | |
|---|---|---|
| 7,741,666 B2 | 6/2010 | Nozaki et al. |
| 2009/0303371 A1* | 12/2009 | Watanabe ......... H01L 27/14603 348/311 |
| 2010/0109060 A1 | 5/2010 | Mao et al. |
| 2010/0177231 A1* | 7/2010 | Tsuchida ............. H01L 27/1462 348/308 |
| 2014/0084135 A1 | 3/2014 | Chen et al. |
| 2014/0285691 A1 | 9/2014 | Honda et al. |
| 2015/0048474 A1* | 2/2015 | Ishiwata ........... H01L 27/14603 257/443 |
| 2016/0211295 A1* | 7/2016 | Chen ................. H01L 27/14621 |

OTHER PUBLICATIONS

U.S. Appl. No. 14/601,010, filed Jan. 20, 2015, Chen et al.

* cited by examiner

S1 = R
S2 = R + 2G + 2B
S3 = R + G
S4 = R + G + 2B

R = S1
G = S3 - S1
G = S2 - S4
B = (S4 - S3)/2

S1 = R + IR
S2 = R + 2G + 2B +IR
S3 = R + G + IR
S4 = R + G + 2B

R = S3 + S4 - S2
G = S3 - S1
IR = S1 + S2 - S3 - S4
B = (S1 + S2 - 2S3)/2

S1 = R
S2 = R + 2G + 2B
S3 = R + G
S4 = R + G + 2B + IR

R = S1
G = S3 - S1
IR = S4 + S3 - S1 - S2
B = (S2 + S1 - 2S3)/2

IMAGE SENSOR WITH ENHANCED QUANTUM EFFICIENCY

BACKGROUND INFORMATION

Field of the Disclosure

The present invention relates generally to semiconductor devices. More specifically, examples of the present invention are related to image sensors with enhanced quantum efficiency.

Background

Image sensors have become ubiquitous. They are widely used in digital still cameras, cellular phones, security cameras, as well as, medical, automobile, and other applications. The technology used to manufacture image sensors, has continued to advance at great pace. For example, the demands of higher resolution and lower power consumption have encouraged the further miniaturization and integration of these devices.

One type of image sensor, the complementary metal oxide semiconductor (CMOS) image sensor, is very popular in commercial electronics. However, as these semiconductor devices have scaled downward, photodiode area has also decreased resulting in a lower incident photon count on each photodiode. Several challenges for down-scaled CMOS image sensors are maintaining low-light sensitivity and reducing image noise—two problems exacerbated by a low incident photon count.

The use of conventional light filter arrays (e.g. red, green, and blue arrays) arranged in known patterns (such as a Bayer pattern or the like) may result in decreased light absorption by the image sensor. This is the product of each light filter only permitting the passage of a small range of visible wavelengths. For instance, a red light filter may permit passage of 750 nm-650 nm photons, but block out the remainder of the visible spectrum. Similarly, a green filter may permit the passage of 500 nm-600 nm photons, but block out the remainder of the visible spectrum. As such, the use of conventional light filter arrays may provide for relatively inefficient absorption of visible photons incident on the image sensor. Similarly, a green filter may permit the passage of 500 nm-600 nm photons, but block out the remainder of the visible spectrum. As such, the use of conventional light filter arrays may provide for relatively inefficient absorption of visible photons incident on the image sensor.

BRIEF DESCRIPTION OF THE DRAWINGS

Non-limiting and non-exhaustive examples of the present invention are described with reference to the following figures, wherein like reference numerals refer to like parts throughout the various views unless otherwise specified.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

As will be shown, methods and apparatuses directed to image sensors with enhanced quantum efficiency are disclosed. In the following description, numerous specific details are set forth in order to provide a thorough understanding of the present invention. One skilled in the relevant art will recognize; however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment," "an embodiment," "one example," or "an example" means that a particular feature, structure, or characteristic described in connection with the embodiment or example is included in at least one embodiment or example of the present invention. Thus, the appearances of the phrases such as "in one embodiment" or "in one example" in various places throughout this specification are not necessarily all referring to the same embodiment or example. Furthermore, the particular features, structures, or characteristics may be combined in any suitable manner in one or more embodiments or examples.

Figure 1A:
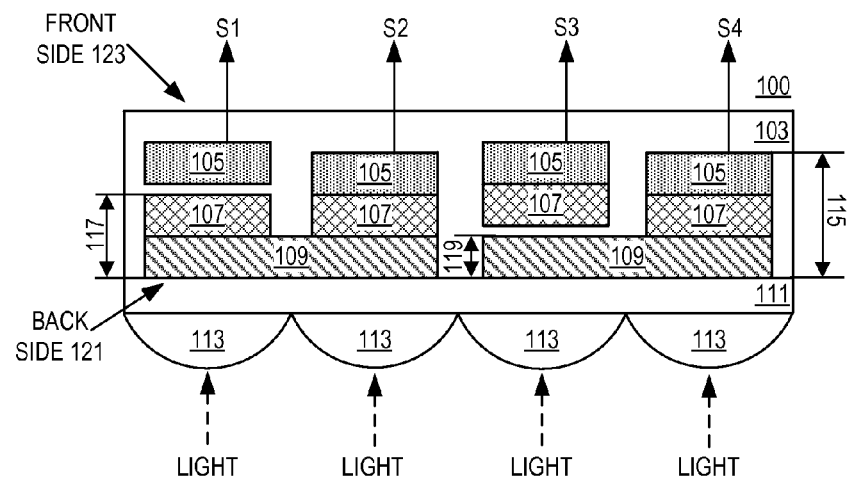
FIG. 1A is a cross-sectional view illustrating one example of a back side illuminated image sensor, in accordance with the teachings of the present invention.

FIG. 1A is a cross-sectional view illustrating one example of a back side illuminated image sensor 100. Back side illuminated image sensor 100 includes semiconductor material 103 which has a front side 123 and a back side 121, a first pixel, and a second pixel. The first pixel includes a first doped region (e.g. blocks 105, 107, and 109) that is disposed proximate to the back side 121 of semiconductor material 103 and extends into semiconductor material 103 a first depth 115. The second pixel includes a second doped region (e.g. block 109 or blocks 107 and 109) that is disposed proximate to the back side 121 of semiconductor material 103 and extends into semiconductor material 103 a second depth (e.g. 117 or 119). In one example, the second depth (e.g. 117 or 119) is less than the first depth 115. In another or the same example, the second doped region may be electrically coupled to the first doped region. The second pixel may also include a third doped region (e.g. block 105 or blocks 105 and 107) disposed between the second doped region (e.g. block 109 or blocks 107 and 109) and the front side 123 of semiconductor material 103. In one example, the third doped region is electrically isolated from the first doped region and the second doped region.

One potential advantage of back side illuminated image sensor 100 is that it may measure red light, green light, and blue light without the use of color/light filters. Block 105 primarily absorbs red light as it is disposed the deepest in semiconductor material 103. Block 107 primarily absorbs green light as it is disposed a middle distance in semiconductor material 103. Block 109 primarily absorbs blue light as it is disposed proximate to the surface of semiconductor material 103. Using extinction length to distinguish between different wavelengths of light is an elegant way to produce a full color image sensor with enhanced quantum efficiency.

In order to measure different light colors, the doped regions in back side illuminated image sensor 100 may take several different configurations. In the depicted example, the first doped region and the second doped region are disposed in semiconductor material 103 to absorb red light, green light, and blue light, and output the image charge generated by red light, green light, and blue light. In one example, the first depth 115 is greater than or equal to the extinction length of red light in semiconductor material 103 such that the first doped region (e.g. blocks 105, 107, and 109) absorbs red light, green light, and blue light. In one example, the second depth 119 is less than the extinction length of green light in semiconductor material 103 such that the second doped region 109 absorbs blue light and allows red light and green light to pass through semiconductor material 103 to be absorbed by the third doped region 105 and 107. In this example, third doped region 105 and 107 outputs the image charge generated by green light and red light. However, in another or the same example, the second depth 117 is less than the extinction length of red light in semiconductor material 103 such that second doped region 107 and 109 absorbs blue light and green light and allows red light to pass through semiconductor material 103 to be absorbed by third doped region 105. In this example, third doped region 105 outputs the image charge generated by red light. In one or more examples, "extinction length" may be defined as the distance light travels in a material at which the majority of the light has been absorbed by the material.

In the depicted example, the doped regions receive incident light and the signals S1, S2, S3, and S4 are output as shown. In one example, signals S1, S2, S3, and S4 may be output to image sensor circuitry disposed on the front side 123 of semiconductor material 103. In one example, the image sensor circuitry may include readout circuitry, control logic, function logic, or the like. Signals S1, S2, S3, and S4 can be used to calculate the red, green, and blue components of the signals by virtue of the doped regions' wavelength-selective absorption. Although the depicted example shows that signals S1, S2, S3, and S4 are readout through the front side 123 of semiconductor material 103 to image sensor circuitry, in another example, signals S1, S2, S3, and S4 may be readout through the back side 121 of semiconductor material 103 or through the sides of semiconductor material 103.

Semiconductor material 103 and the doped regions can be fabricated from a wide array of semiconductor elements and compounds. In one example, semiconductor material 103 may include silicon; however, in the same or a different example, semiconductor material 103 may include germanium, gallium, arsenic, boron, or the like. In one example, semiconductor material 103 is p-type, and the first doped region, the second doped region, and the third doped region are n-type. However, in a different example, semiconductor material 103 is n-type, and the first doped region, the second doped region, and the third doped region are p-type.

In the depicted example, back side illuminated image sensor 100 further includes an interlayer 111 disposed proximate to the back side 121 of semiconductor material 103. Further, a microlens layer may be disposed proximate to semiconductor material 103 such that interlayer 111 is disposed between semiconductor material 103 and microlens layer 113. Microlens layer 113 may be positioned to direct incident photons into the first pixel and the second pixel. In one example, microlens layer 113 may be fabricated from a polymer including photoresist.

Additionally, the example depicted in FIG. 1A shows that the second doped region extends over the third doped region, and that the lateral bound of the second doped region is aligned with the lateral bound of the third doped region. However, in other examples not depicted, the second doped region may extend beyond the lateral bounds of the third doped region. Alternatively, in other examples, the second doped region may not extend entirely over the third doped region.

Figure 1B:
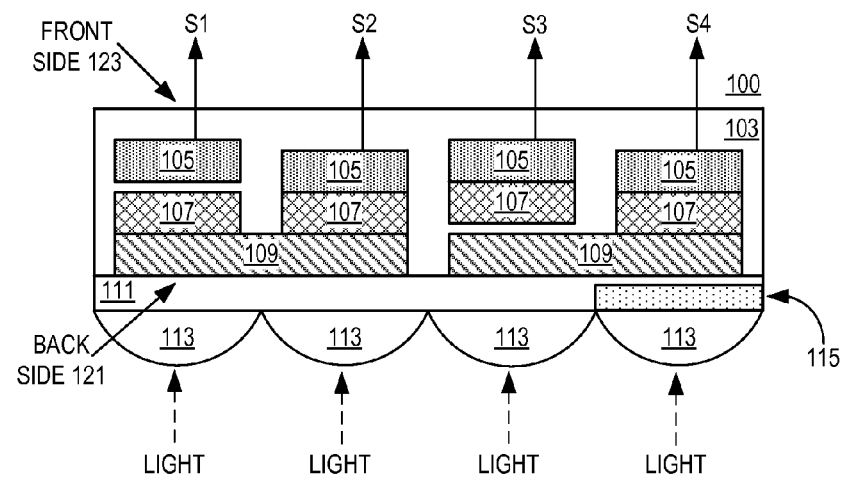
FIG. 1B is a cross-sectional view illustrating one example of a back side illuminated image sensor with an infrared light blocker, in accordance with the teachings of the present invention.

FIG. 1B is a cross-sectional view illustrating one example of a back side illuminated image sensor 100 with infrared light blocker 115 disposed proximate to back side 121 of semiconductor material 103. In one example, infrared light blocker 115 is positioned to prevent infrared light from reaching at least one doped region. In the depicted example, infrared light blocker 115 is disposed to prevent infrared light from reaching first doped region (e.g. blocks 105, 107, and 109). When back side illuminated image sensor 100 is fabricated with four pixels—each of which measuring a unique signal comprised of blue light, green light, red light, and infrared light—back side illuminated image sensor 100 can be used to output individual blue, green, red, and infrared signals without use of light/color filters. This may improve image sensor performance, as the entire visible spectrum is being measured, rather than individual pixels receiving only a small fraction of the spectrum.

Figure 1C:
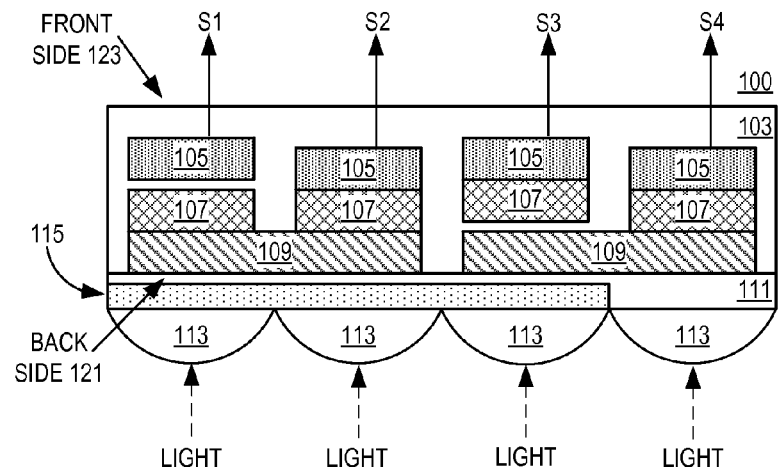
FIG. 1C is a cross-sectional view illustrating one example of a back side illuminated image sensor with an infrared light blocker, in accordance with the teachings of the present invention.

FIG. 1C is a cross-sectional view illustrating one example of a back side illuminated image sensor 100 with infrared light blocker 115. In the depicted example, infrared light blocker 115 is disposed to prevent infrared light from reaching a plurality of the doped regions. As in FIG. 1B, when back side illuminated image sensor 100 is fabricated with four pixels—each of which measuring a unique signal comprised of blue light, green light, red light, and infrared light—back side illuminated image sensor 100 can be used to output individual blue, green, red, and infrared signals without use of color filters.

Figure 2A:
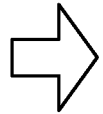
FIG. 2A illustrates a method for calculating blue, green, and red signals using the back side illuminated image sensor depicted in FIG. 1A, in accordance with the teachings of the present invention.

FIG. 2A illustrates a method for calculating blue, green, and red signals using the back side illuminated image sensor shown in FIG. 1A. In the depicted example, S1 (e.g. block 105) measures red light—as only red light can reach block 105. S2 (e.g. blocks 105, 107, and 109) measures: one red signal—as only one block 105 outputs into S2; two green signals—as two blocks 107 output into S2; and two blue signals—as block 109 has roughly twice as much surface area as blocks 105 and 107. S3 (e.g. blocks 105 and 107) measures one red signal and one green signal—as one block 105 and one block 107 output to S3. S4 (e.g. blocks 105, 107, and 109) measures: one red signal—as only one block 105 outputs into S4; one green signal—as one block 107 outputs into S4; and two blue signals—as block 109 has roughly twice as much surface area as blocks 105 and 107, and outputs to S4. Accordingly, in the example depicted in FIG. 2A, the signals are output as follows: S1=R; S2=R+2G+2B; S3=R+G; S4=R+G+2B. Using linear algebra, the individual red, green, and blue components can be solved for. In the depicted example, the color signals may be: R=S1; G=S3−S1; G=S2−S4; B=(S4−S3)/2. However, in one example these signals may be modified as needed to account for optical effects and device optimization.

Figure 2B:
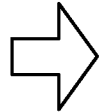
FIG. 2B illustrates a method for calculating blue, green, red, and infrared signals using the back side illuminated image sensor depicted in FIG. 1B, in accordance with the teachings of the present invention.

FIG. 2B illustrates a method for calculating blue, green, red, and infrared signals using the back side illuminated image sensor depicted in FIG. 1B. All sources S1, S2, S3, S4 measure the same portions of the visible spectrum as in FIG. 2A. However, S4 is prevented from receiving infrared light, as an infrared light blocker (e.g. infrared light blocker 115) is disposed to prevent infrared light from reaching one of the doped regions. As such, S1, S2, and S3 output their visible spectrum signals and an infrared signal, while S4 outputs only its visible spectrum signal without an infrared signal. Accordingly, in the example depicted in FIG. 2B, the signals are output as follows: S1=R+IR; S2=R+2G+2B+IR; S3=R+G+IR; S4=R+G+2B. Using linear algebra, the individual red, green, blue, and infrared components can be solved for. In the depicted example, the color signals may be: R=S3+S4−S2; G=S3−S1; IR=S1+S2−S3−S4; B=(S1+S2−2S3)/2.

Figure 2C:
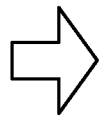
FIG. 2C illustrates a method for calculating blue, green, red, and infrared signals using the back side illuminated image sensor depicted in FIG. 1C, in accordance with the teachings of the present invention.

FIG. 2C illustrates a method for calculating blue, green, red, and infrared signals using the back side illuminated image sensor depicted in FIG. 1C. All sources S1, S2, S3, S4 measure the same portions of the visible spectrum as in FIG. 2A. However, S1, S2, and S3 are prevented from receiving infrared light as an infrared light blocker (e.g. infrared light blocker 115) is disposed to prevent infrared light from reaching several doped regions. As such, S4 outputs its visible spectrum signal and an infrared signal, while S1-S3 output only their visible spectrum signal without an infrared signal. Accordingly, in the example depicted in FIG. 2C, the signals are output as follows: S1=R; S2=R+2G+2B; S3=R+G; S4=R+G+2B+IR. Using linear algebra, the individual red, green, blue, and infrared components can be solved for. In the depicted example, the color signals may be: R=S1; G=S3−S1; IR=S4+S3−S1−S2; B=(S2+S1−2S3)/2. Although the examples depicted only show four signal sources, in one example, a plurality of infrared light blockers are disposed proximate to the pixel array and the infrared light blockers prevent infrared light from reaching at least one pixel in the pixel array.

Figure 3:
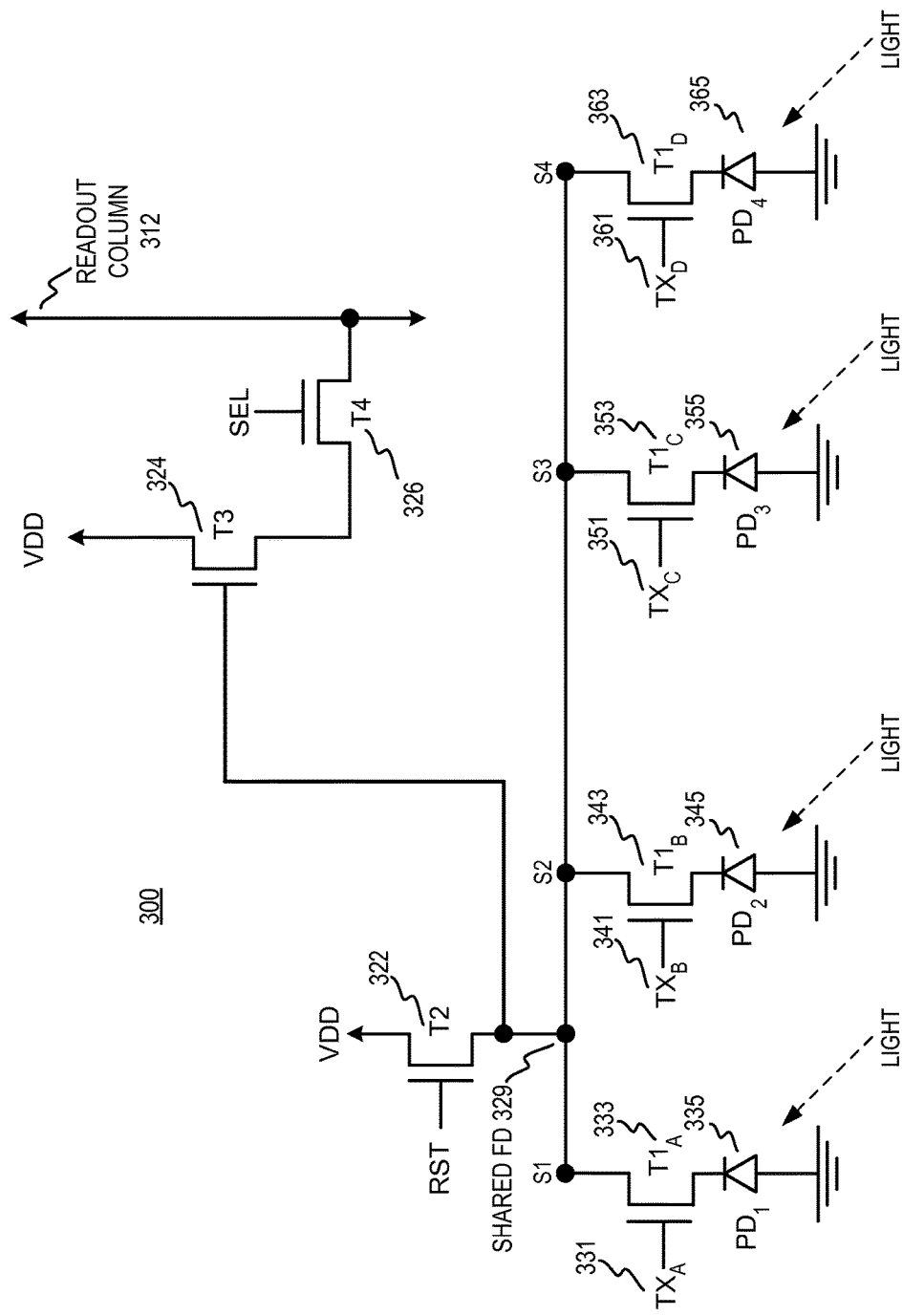
FIG. 3 is a schematic illustrating one example of an image sensor circuit, in accordance with the teachings of the present invention.

FIG. 3 is a schematic illustrating one example of a portion of image sensor circuitry 300. In one example, the image sensor circuitry 300 may be disposed on the front side of semiconductor material that includes an image sensor in accordance with the teachings of the present invention. In the depicted example, image sensor circuitry 300 includes: first photodiode 335; second photodiode 345; third photodiode 355; fourth photodiode 365; first transfer transistor 333; second transfer transistor 343; third transfer transistor 353; fourth transfer transistor 363; floating diffusion 329; reset transistor 322; amplifier transistor 324; and row select transistor 326 coupled to readout column 312.

In operation, image charge is accumulated in first photodiode 335, second photodiode 345, third photodiode 355, and fourth photodiode 365 (all of which may include blocks 105, 107, and/or 109). When incident light enters the photodiodes and is converted into hole-electron pairs, image charge may be transferred to floating diffusion 329 to be readout as image data. First transfer transistor 333, second transfer transistor 343, third transfer transistor 353, and fourth transfer transistor 363 may be coupled between the photodiodes and floating diffusion 329 to selectively transfer the image charge from first photodiode 335, second photodiode 345, third photodiode 355, and fourth photodiode 365 to floating diffusion 329. In one example, the floating diffusion is electrically coupled to the first doped region (e.g. blocks 105, 107, and 109) and the third doped region (e.g. blocks 105 and 107 or block 105). In another or the same example, first transfer transistor 333 is electrically coupled between the first doped region (e.g. blocks 105, 107, and 109) and the floating diffusion 329 and the second transfer transistor 343 is electrically coupled between the third doped region (e.g. blocks 105 and 107 or block 105) and the floating diffusion 329. In one example, the transfer transistors may output signals S1, S2, S3, and S4 from the photodiodes to floating diffusion 329 and other image sensor circuitry.

The example in FIG. 3 also illustrates reset transistor 322 as coupled between a reset voltage $V_{DD}$ and floating diffusion 329 to selectively reset the charge in floating diffusion 329 in response to a reset signal RST. In the depicted example, amplifier transistor 324 includes an amplifier gate coupled to floating diffusion 329 to amplify the signal on floating diffusion 329 to output image data. Row select transistor 326 is coupled between readout column 312 and amplifier transistor 324 to output the image data to readout column 312.

In the depicted example, four photodiodes share the same floating diffusion 329. In this example, each photodiode has its own transfer transistor. Charge may be transferred from the four photodiodes to the floating diffusion 329 in series or simultaneously by applying a voltage to each transfer transistor. Although the example depicted in FIG. 3 shows four photodiodes connected to floating diffusion 329, in a different example, any number of photodiodes can be connected to floating diffusion 329. For instance, in an alternate example, each photodiode may be coupled to its own floating diffusion and reset transistor.

Figure 4:
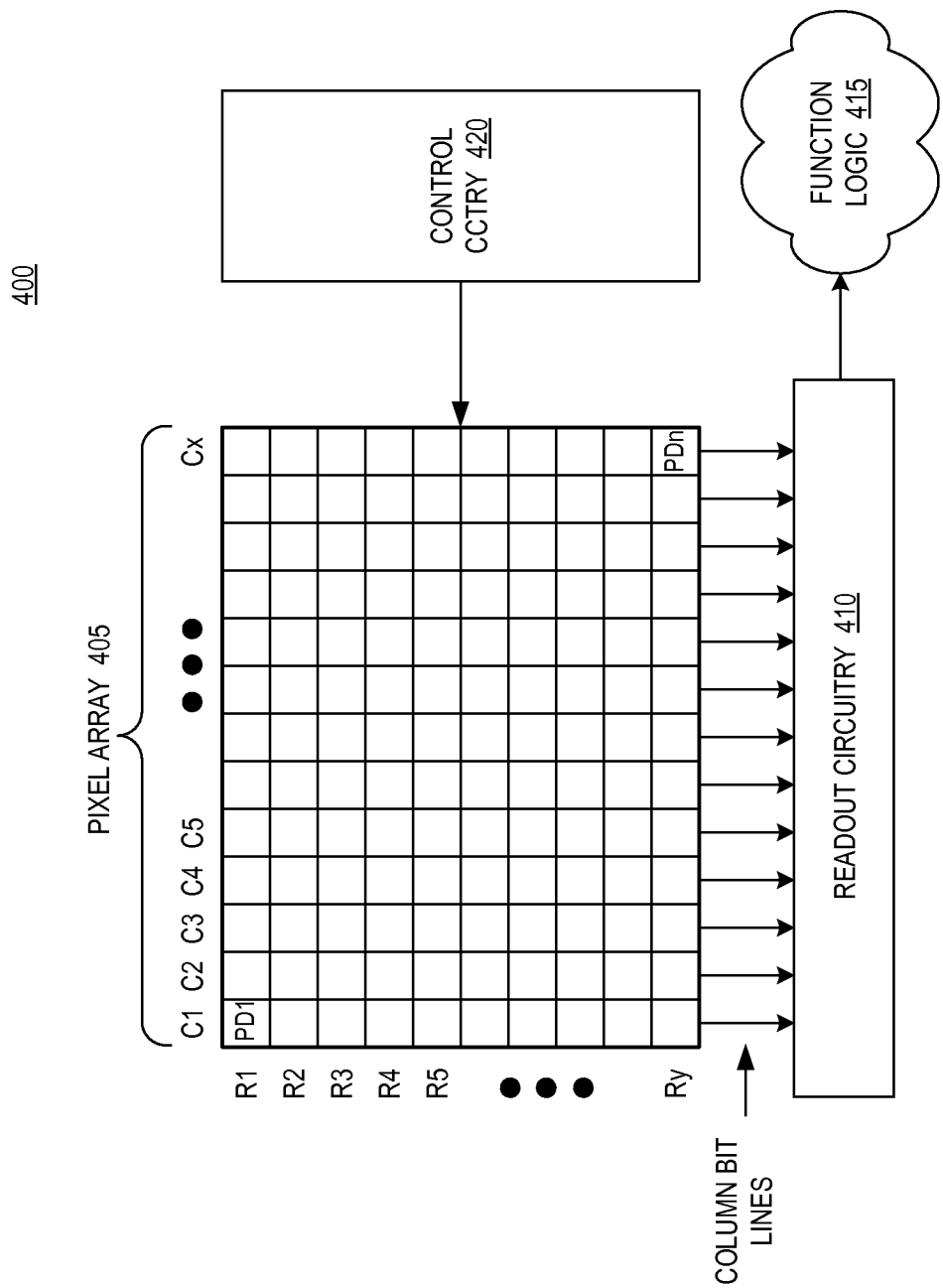
FIG. 4 is a diagram illustrating one example of an imaging system, in accordance with the teachings of the present invention.

FIG. 4 is a diagram illustrating one example of an imaging system. Imaging system 400 includes pixel array 405, readout circuitry 410, function logic 415, and control circuitry 420. In one example, readout circuitry 410, function logic 415, and control circuitry 420 may be included in image sensor circuitry used to control operation of pixel array 405 and to readout image charge from the pixel array 405 in accordance with the teachings of the present invention. Each pixel in pixel array 405 (e.g. pixels P1, P2 . . . , Pn) includes at least one doped region (e.g. doped regions fabricated from blocks 105, 107, and/or 109) disposed in a semiconductor material (e.g. semiconductor material 103). In one example, pixel array 405 is a two-dimensional (2D) array of individual pixels (e.g. pixels P1, P2 . . . , Pn) including rows (e.g. rows R1 to Ry.) and columns (e.g. column C1 to Cx). In another or the same example, a first pixel and a second pixel are arranged in a 2-by-2 array in pixel array 405. The 2-by-2 array may include two of the first pixel and two of the second pixel with coupled first and second doped regions. The 2-by-2 array may repeat itself to form pixel array 405, and the second doped regions within the individual 2-by-2 arrays may be decoupled from the second doped regions in other 2-by-2 arrays. Pixel array 405 may be used to acquire image data of a person, place, object, etc., which can then be used to render a 2D image of the person, place, object, etc. In one example, after each image sensor pixel in pixel array 405 has acquired its image data or image charge, image charge is then readout by readout circuitry 410 and transferred to function logic 415. In one example, readout circuitry 410 is coupled to readout the image charge from a floating diffusion (e.g. floating diffusion 329) and function logic 415 is coupled to readout circuitry 410 to perform logic operations on the image charge. In one example, function logic may transform signals from pixel array 405 (e.g. signals S1, S2, S3, and S4) into their respective red, green, blue, and/or infrared components using the functions described above in connection with FIG. 2.

In various examples, readout circuitry 410 may include amplification circuitry, analog-to-digital (ADC) conversion circuitry, or otherwise. Function logic 415 may simply store the image data or even manipulate the image data by applying post image effects (e.g. crop, rotate, remove red eye, adjust brightness, adjust contrast, or otherwise). In one example, readout circuitry 410 may readout a row of image data at a time along readout column lines (illustrated) or may readout the image data using a variety of other techniques (not illustrated), such as a serial readout or a full parallel readout of all pixels simultaneously.

In one example, control circuitry 420 is coupled to control operation of the pixels (e.g. P1, P2, P3, etc.) in pixel array 405. For example, control circuitry 420 may generate a shutter signal for controlling image acquisition. In one example, the shutter signal is a global shutter signal for simultaneously enabling all pixels within pixel array 405 to simultaneously capture their respective image data during a single acquisition window. In another example, the shutter signal is a rolling shutter signal such that each row, column, or group of pixels is sequentially enabled during consecutive acquisition windows. In another example, image acquisition is synchronized with lighting effects such as a flash.

In one example, imaging system 400 may be included in a digital camera, cell phone, laptop computer, or the like. Additionally, imaging system 400 may be coupled to other elements of hardware such as a processor, memory elements, output (USB port, wireless transmitter, HDMI port, etc.), lighting/flash, electrical input (keyboard, touch display, track pad, mouse, microphone, etc.), and/or display. Other elements of hardware may deliver instructions to imaging system 400, extract image data from imaging system 400, or manipulate image data supplied by imaging system 400.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example structures, materials, use-cases etc., are provided for explanation purposes and that substitutes may also be employed in other embodiments and examples in accordance with the teachings of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. A back side illuminated image sensor, comprising:
    a pixel array including a semiconductor material having a front side and a back side;
    image sensor circuitry disposed on the front side of the semiconductor material to control operation of the pixel array and to readout image charge from the pixel array;
    a first pixel in the pixel array including a first doped region, wherein the first doped region is disposed in the semiconductor material proximate to the back side and extends into the semiconductor material a first depth to reach the image sensor circuitry; and
    a second pixel in the pixel array including:
        a second doped region, wherein the second doped region is disposed proximate to the back side of the semiconductor material and extends into the semiconductor material a second depth which is less than the first depth; and
        a third doped region, wherein the third doped region is disposed between the second doped region and the image sensor circuitry on the front side of the semiconductor material, and wherein the third doped region is electrically isolated from the first doped region and the second doped region; and
    wherein the first pixel and the second pixel are arranged in a 2-by-2 array, and wherein the 2-by-2 array includes two of the first pixel and two of the second pixel.

2. The back side illuminated image sensor of claim 1 wherein the first doped region and the second doped region are electrically coupled.

3. The back side illuminated image sensor of claim 2 wherein the 2-by-2 array repeats itself, and wherein the second doped region within the individual 2-by-2 arrays is decoupled from the second doped region in other 2-by-2 arrays.

4. The back side illuminated image sensor of claim 1 wherein the first depth is greater than or equal to the extinction length of red light in the semiconductor material such that the first doped region absorbs red light, green light, and blue light.

5. The back side illuminated image sensor of claim 1 wherein the second depth is less than the extinction length of green light in the semiconductor material and greater than the extinction length of blue light in the semiconductor material such that the second doped region absorbs blue light and allows red light and green light to pass through the semiconductor material to be absorbed by the third doped region.

6. The back side illuminated image sensor of claim 1 wherein the second depth is less than the extinction length of red light in the semiconductor material and greater than the extinction length of blue light and green light in the semiconductor material such that the second doped region absorbs blue light and green light and allows red light to pass through the semiconductor material to be absorbed by the third doped region.

7. The back side illuminated image sensor of claim 1 wherein the semiconductor material is p-type and the first doped region, the second doped region, and the third doped region are n-type.

8. The back side illuminated image sensor of claim 1 further comprising an infrared light blocker disposed proximate to the back side of the semiconductor material, wherein the infrared light blocker is positioned to prevent infrared light from reaching at least one doped region.

9. The back side illuminated image sensor of claim 1 further comprising an interlayer disposed proximate to the back side of the semiconductor material.

10. The back side illuminated image sensor of claim 9 further comprising a microlens layer, wherein the interlayer is disposed between the semiconductor material and the microlens layer, wherein the microlens layer is positioned to direct incident photons into the first pixel and the second pixel.

11. An imaging system, comprising:
   a pixel array including a semiconductor material having a front side and a back side;
   image sensor circuitry disposed on the front side of the semiconductor material to control operation of the pixel array and readout image charge from the pixel array;
   a first pixel in the pixel array including a first doped region, wherein the first doped region is disposed proximate to the back side of the semiconductor material and extends into the semiconductor material a first depth; and
   a second pixel in the pixel array including:
      a second doped region, wherein the second doped region is disposed proximate to the back side of the semiconductor material and extends into the semiconductor material a second depth which is less than the first depth; and
      a third doped region, wherein the third doped region is disposed between the second doped region and the front side of the semiconductor material, and wherein the third doped region is electrically isolated from the first doped region and the second doped region;
   and wherein the first pixel and the second pixel are arranged in a 2-by-2 array including two of the first pixel and two of the second pixel.

12. The imaging system of claim 11 wherein the first doped region and the second doped region are disposed in the semiconductor material to absorb red light, green light, and blue light, and output the image charge generated by red light, green light, and blue light.

13. The imaging system of claim 11 wherein the third doped region is disposed in the semiconductor material to absorb green light and red light, and outputs the image charge generated by green light and red light.

14. The imaging system of claim 11 wherein the third doped region is disposed in the semiconductor material to absorb red light, and outputs the image charge generated by red light.

15. The imaging system of claim 11 further comprising a plurality of infrared light blockers disposed proximate to the pixel array, wherein the infrared light blockers prevent infrared light from reaching at least one pixel in the pixel array.

16. The imaging system of claim 11 further comprising a microlens layer disposed proximate to the pixel array, wherein the microlens layer is positioned to direct photons into individual pixels in the pixel array.

17. The imaging system of claim 11 further comprising a floating diffusion, wherein the floating diffusion is electrically coupled to the first doped region and the third doped region.

18. The imaging system of claim 17 further comprising a first transfer transistor and a second transfer transistor, wherein the first transfer transistor is electrically coupled between the first doped region and the floating diffusion and the second transfer transistor is electrically coupled between the third doped region and the floating diffusion.

19. The imaging system of claim 11 wherein the image sensor circuitry comprises control circuitry to control operation of the pixel array, and readout circuitry to readout the image charge from the pixel array.

20. The imaging system of claim 11 further comprising function logic coupled to the image sensor circuitry, wherein the function logic performs operations on the image charge readout from the pixel array.

\* \* \* \* \*